(12) United States Patent
Adachi

(10) Patent No.: US 7,391,214 B2
(45) Date of Patent: Jun. 24, 2008

(54) MAGNETIC RESONANCE IMAGING APPARATUS, COIL SYSTEM FOR A MAGNETIC RESONANCE IMAGING APPARATUS AND MAGNETIC RESONANCE IMAGING METHOD

(75) Inventor: Kohei Adachi, Nasushiobara (JP)

(73) Assignees: Kabushiki Kaisha Toshiba, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 0 days.

(21) Appl. No.: 11/645,004

(22) Filed: Dec. 26, 2006

(65) Prior Publication Data

US 2007/0176601 A1 Aug. 2, 2007

(30) Foreign Application Priority Data

Jan. 6, 2006 (JP) ............................. 2006-001515
Dec. 1, 2006 (JP) ............................. 2006-325973

(51) Int. Cl.
*G01V 3/00* (2006.01)

(52) U.S. Cl. ....................................... 324/318; 324/322

(58) Field of Classification Search ......... 324/300–322; 600/407–455; 455/133
See application file for complete search history.

(56) References Cited

U.S. PATENT DOCUMENTS

| 5,245,288 | A | 9/1993 | Leussler |
| 5,384,536 | A | 1/1995 | Murakami et al. |
| 6,791,322 | B2 | 9/2004 | Vester |
| 6,961,604 | B1 * | 11/2005 | Vahasalo et al. ............. 600/410 |
| 6,975,751 | B2 * | 12/2005 | Pauly et al. .................. 382/130 |
| 7,260,369 | B2 * | 8/2007 | Feher .......................... 455/133 |
| 2006/0214662 | A1 | 9/2006 | Adachi |
| 2007/0205769 | A1 * | 9/2007 | Yui et al. ..................... 324/318 |

* cited by examiner

*Primary Examiner*—Brij B Shrivastav
(74) *Attorney, Agent, or Firm*—Nixon & Vanderhye P.C.

(57) ABSTRACT

A magnetic resonance imaging apparatus includes a receiver coil, at least one transmitter antenna, receiver antennas, a signal selection unit and a processing unit. The receiver coil receives a nuclear magnetic resonance signal from an object as a reception signal. The transmitter antenna transmits the reception signal by radio. The receiver antennas are arranged to receive the reception signal. The signal selection unit selects a reception signal received by a specific receiver antenna. The processing unit reconstructs an image of the object from the reception signal selected by the signal selection unit.

23 Claims, 5 Drawing Sheets

MAGNETIC RESONANCE IMAGING APPARATUS, COIL SYSTEM FOR A MAGNETIC RESONANCE IMAGING APPARATUS AND MAGNETIC RESONANCE IMAGING METHOD

BACKGROUND OF THE INVENTION

1. Field of the Invention

The present invention relates to a magnetic resonance imaging apparatus, a coil system for a magnetic resonance imaging apparatus and a magnetic resonance imaging method which excite nuclear spin of an object magnetically with a RF (radio frequency) signal having a Larmor frequency and reconstruct an image based on a magnetic resonance signal generated due to the excitation, and more particularly, to a magnetic resonance imaging apparatus, a coil system for a magnetic resonance imaging apparatus and a magnetic resonance imaging method which transmit a reception signal received by a RF receiver coil to a signal processing system by radio.

2. Description of the Related Art

MRI (Magnetic Resonance Imaging) apparatuses are used as monitoring devices in medical field conventionally.

An MRI apparatus is an apparatus which generates gradient magnetic fields in X, Y and Z axis directions by gradient coils on an imaging area of an object set in a cylindrical static field magnet for producing a static magnetic field, resonates nuclear spins in the object magnetically by transmitting RF signals from an RF transmitter coil and reconstructs an image of the object by using NMR (Nuclear Magnetic Resonance) signals generated due to an excitation.

The MRI apparatus like this employs a reception coil composed of a plurality of element coils for receiving NMR signals. Nowadays, the number of element coils included in the reception coil increases. However, the increase in the number of element coils in the reception coil increases cable wiring for transmitting reception signals obtained in the element coils to a signal processing system, and wiring of cables connected to moving element coils are subjected to various restrictions.

To address the problem of various restrictions on the cable wiring, a wireless coil system is proposed in which reception signals received by reception element coils is wirelessly transmitted to a signal processing system (see, for example, Japanese Patent Application No. 2005-505361).

To reduce labor of not only cable wiring for a reception coil but also other various kinds of cable wiring work, a technique employing optical communications (see, for example, U.S. Pat. No. 6,925,322) or wireless communications (see, for example, Japanese Patent Application No. H03-085145) is also proposed.

In addition, U.S. Pat. No. 5,384,536 discloses a wireless technique in an MRI apparatus, U.S. Pat. No. 5,245,288 discloses a wireless technique including a synchronous circuit in an MRI apparatus, and U.S. Pat. No. 6,791,322 discloses a wireless technique including a compression/extension circuit for improving a dynamic range by distortion correction in an MRI apparatus.

However, in known wireless coil systems, reception element coils are movable together with a table, whereas a receiver for wireless communications in a signal processing system is fixed. Therefore, the distance between a transmitter for wireless communications connected to each of the element coils and the receiver in the signal processing system varies depending on the position of the element coil, so that it is difficult to uniformly optimize the distance between the transmitter and the receiver. If the distance between the transmitter and the receiver is nonuniform, an SNR (signal to noise ratio) is decreased by signal attenuation accompanied by space propagation of a reception signal.

One approach to address the problem is a combined use of techniques of compression/expansion of an AM (Amplitude Modulation) signal, ACSB (Amplitude Compressed Single side Band), linear modulation, and/or other techniques to keep a sufficient SNR. However, this approach cannot avoid deterioration in a reception signal caused by signal compression with respect to a dynamic range required for an MRI apparatus and a complicated circuit structure.

Moreover, known wireless coil systems have no means for keeping a uniform spatial distance between the transmitter connected to each of the reception element coils whose arrangement varies with each imaging section, as described above, and the receiver in the signal processing system. Therefore, it is necessary to limit the arrangement of the element coils to suppress variations in the SNR. In addition, the variations in the SNR lead to image quality degradation.

SUMMARY OF THE INVENTION

The present invention has been made in light of the conventional situations, and it is an object of the present invention to provide a magnetic resonance imaging apparatus, a coil system for a magnetic resonance imaging apparatus and a magnetic resonance imaging method which make it possible to optimize a distance between a transmitter for radio transmission connected with element coils in a receiver coil and a receiver, which makes a pair to the transmitter, of a signal processing system to improve deterioration of signal-noise ratio due to attenuation of signals involving spatial propagation of reception signals transmitted by radio.

The present invention provides a magnetic resonance imaging apparatus comprising: a receiver coil configured to receive a nuclear magnetic resonance signal from an object as a reception signal; at least one reception signal transmitter antenna configured to transmit the reception signal from said receiver coil by radio; reception signal receiver antennas arranged to receive the reception signal transmitted from said reception signal transmitter antenna; a signal selection unit configured to select a reception signal received by a specific reception signal receiver antenna of said reception signal receiver antennas; and a reception data processing unit configured to reconstruct an image of the object from the reception signal selected by said signal selection unit, in an aspect to achieve the object.

The present invention also provides a coil system for a magnetic resonance imaging apparatus comprising: a receiver coil configured to receive a nuclear magnetic resonance signal from an object as a reception signal; at least one reception signal transmitter antenna configured to transmit the reception signal from said receiver coil by radio; reception signal receiver antennas arranged to receive the reception signal transmitted from said reception signal transmitter antenna; and a signal selection unit configured to select a reception signal received by a specific reception signal receiver antenna of said reception signal receiver antennas, in an aspect to achieve the object.

The present invention also provides a magnetic resonance imaging method comprising: receiving a nuclear magnetic resonance signal from an object as a reception signal; transmitting the received reception signal by radio; receiving the reception signal transmitted by radio by reception signal receiver antennas; selecting a reception signal received by a specific reception signal receiver antenna of the reception signal receiver antennas; and reconstructing an image of the object from the selected reception signal, in an aspect to achieve the object.

The magnetic resonance imaging apparatus, the coil system for a magnetic resonance imaging apparatus and the magnetic resonance imaging method as described above make it possible to optimize a distance between a transmitter for radio transmission connected with element coils in a receiver coil and a receiver, which makes a pair to the transmitter, of a signal processing system to improve deterioration of signal-noise ratio due to signal attenuation involving spatial propagation of reception signals transmitted by radio.

DESCRIPTION OF THE PREFERRED EMBODIMENTS

A magnetic resonance imaging apparatus, a coil system for a magnetic resonance imaging apparatus and a magnetic resonance imaging method according to embodiments of the present invention will be described with reference to the accompanying drawings.

Figure 1:
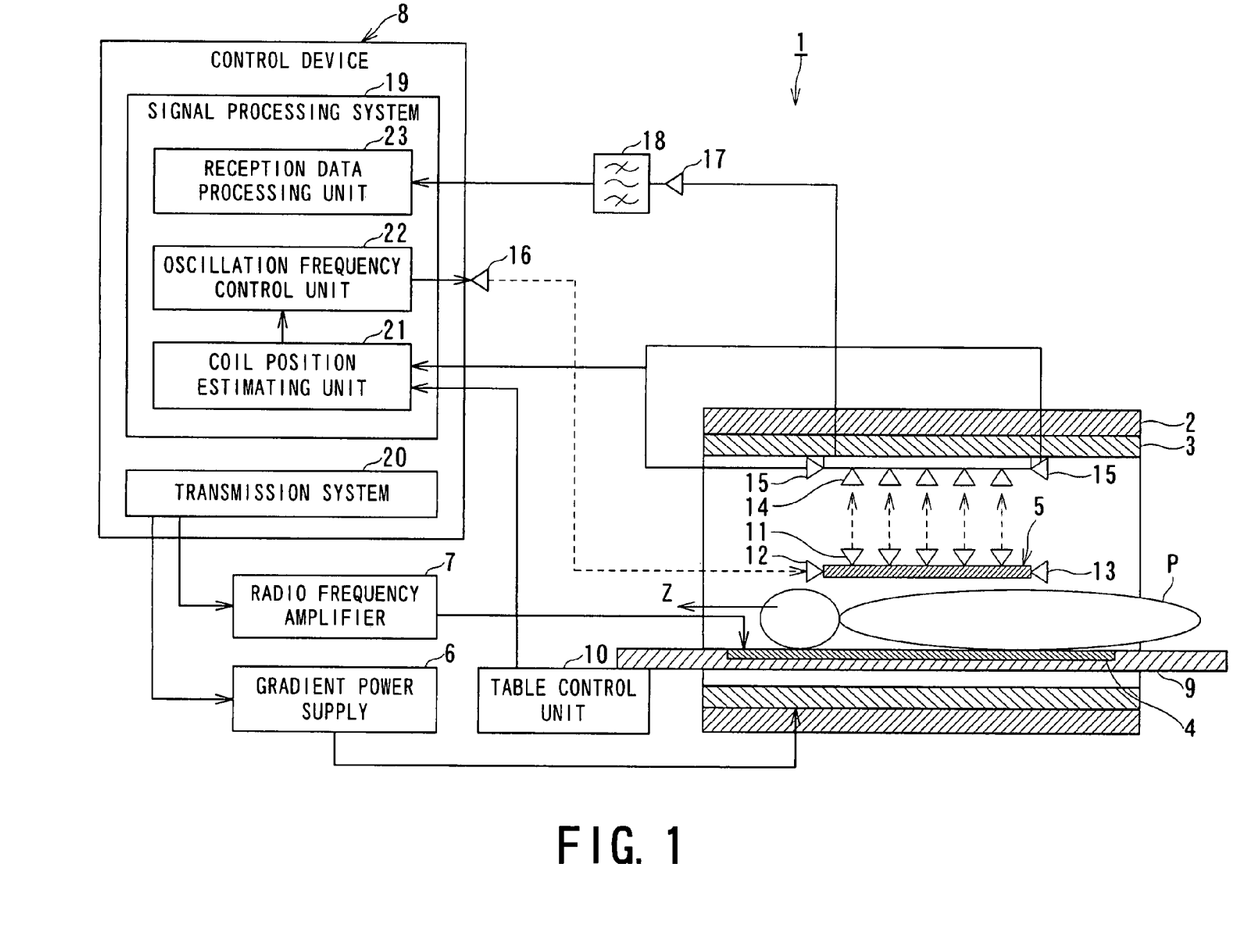
FIG. 1 is a diagram of a magnetic resonance imaging apparatus according to a first embodiment of the present invention.

FIG. 1 is a diagram of a magnetic resonance imaging apparatus according to a first embodiment of the present invention.

A magnetic resonance imaging apparatus 1 includes a static field magnet 2, a gradient coil 3, a radio-frequency transmission coil 4, a radio-frequency reception coil 5, a gradient power supply 6, a radio frequency amplifier 7, and a control device 8 as main elements. The static field magnet 2, the gradient coil 3, the radio-frequency transmission coil 4, and the radio-frequency reception coil 5 are disposed on a gantry (not shown). The cylindrical gradient coil 3 is disposed inside the cylindrical static field magnet 2 forming a static field. Inside the gradient coil 3, an imaging region is present, and the radio-frequency transmission coil 4, the radio-frequency reception coil 5, and a table 9 are disposed. An object P is placed on the table 9.

The table 9 is provided with a table control unit 10. The table 9 can be moved in the body axis direction (Z-direction) of the object P by use of the table control unit 10. The table control unit 10 is controlled by a control signal from the control device 8 and functions to supply the control device 8 with positional information on the table 9. The radio-frequency transmission coil 4 and the radio-frequency reception coil 5 are movable together with the table 9.

The gradient coil 3 is connected to the gradient power supply 6. A current supplied from the gradient power supply 6 generates desired gradient magnetic fields in the imaging region inside the gradient coil 3.

In response to a radio-frequency transmission signal having a predetermined amplified intensity from the radio frequency amplifier 7, the radio-frequency transmission coil 4 functions to transmit the radio-frequency transmission signal toward an imaging section of the object P placed in the imaging region.

The radio-frequency reception coil 5 functions to receive an NMR signal generated by transmission of the radio-frequency transmission signal to the object P in the gradient magnetic fields and to supply the control device 8 with the NMR signal as a radio-frequency reception signal. The radio-frequency reception signal output from the radio-frequency reception coil 5 is wirelessly supplied to the control device 8.

The radio-frequency transmission coil 4 and the radio-frequency reception coil 5 may be a common coil. The radio-frequency transmission signal can be wirelessly transmitted from the radio frequency amplifier 7 to the radio-frequency transmission coil 4. Here, a case is described in which the radio-frequency transmission coil 4 is separate from the radio-frequency reception coil 5 and the radio-frequency reception signal is wirelessly transmitted.

The radio-frequency reception coil 5 is provided with a plurality of reception-signal transmission antennas 11, a digital-communication reception antenna 12, and a positional-detection transmission antenna 13. The gantry, which serves as a fixed system, is provided with a plurality of reception-signal reception antennas 14 at locations where the reception-signal reception antennas 14 can receive radio waves from the reception-signal transmission antennas 11. The fixed gantry is provided with at least two positional-detection reception antennas 15 at locations where the positional-detection reception antennas 15 can receive radio waves from the positional-detection transmission antenna 13. The control device 8 is provided with a digital-communication transmission antenna 16 for transmitting radio waves toward the digital-communication reception antenna 12.

The reception-signal transmission antennas 11 disposed on the radio-frequency reception coil 5, which serves as a movable system, are arranged along the direction of movement of the table 9. Preferably, the reception-signal transmission antennas 11 may be spaced at regular intervals along the direction of movement of the table 9. The reception-signal reception antennas 14, which are provided on the fixed system, are also arranged at least along the direction of movement of the table 9. Preferably, the reception-signal reception antennas 14 may also be spaced at regular intervals along the direction of movement of the table 9. Arranging the reception-signal transmission antennas 11 and the reception-signal reception antennas 14 so as to be spaced at regular intervals can facilitate obtaining of their geometric positional relationships and can simplify signal processing and operation required for image reconstruction.

The reception-signal reception antennas 14 may be arranged along a direction different from the direction of movement of the table 9 (typically the Z-direction, or the body axis direction), for example, along the X-direction or the body width direction of the object P.

From the viewpoint of suppressing adverse effects of a nonuniform static magnetic field, it is preferable that the reception-signal reception antennas 14 may be disposed at locations which have less of the effects of the nonuniform static magnetic field, for example, adjacent to the center inside the static field magnet 2. FIG. 1 shows a first example in which the reception-signal reception antennas 14 are arranged adjacent to the center inside the static field magnet 2 (i.e., inside the gradient coil 3). As a second example of arrangement of the reception-signal reception antennas 14, the plurality of reception-signal reception antennas 14 may be disposed adjacent to ends inside the static field magnet 2.

Figure 2:
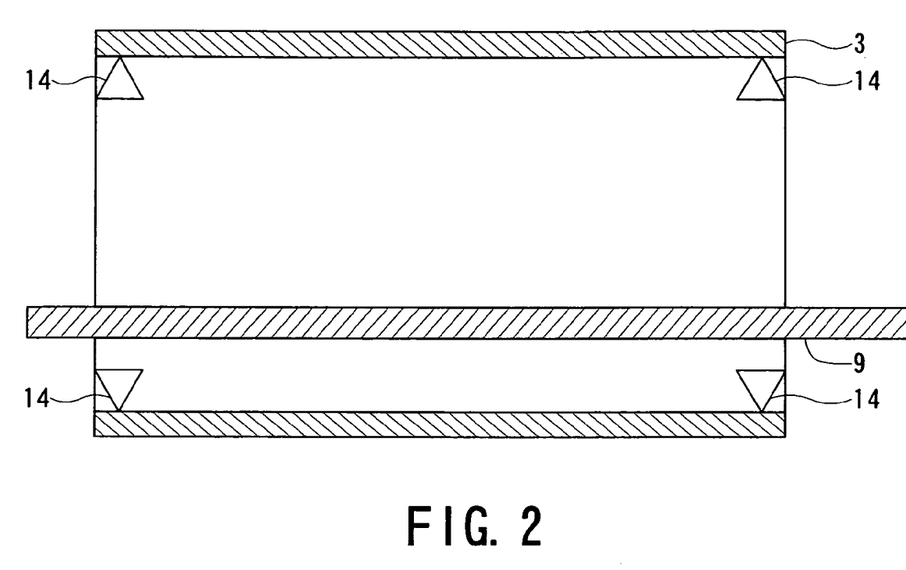
FIG. 2 is a cross-sectional view of the second example of arrangement of the reception-signal reception antennas illustrated in FIG. 1.
Figure 3:
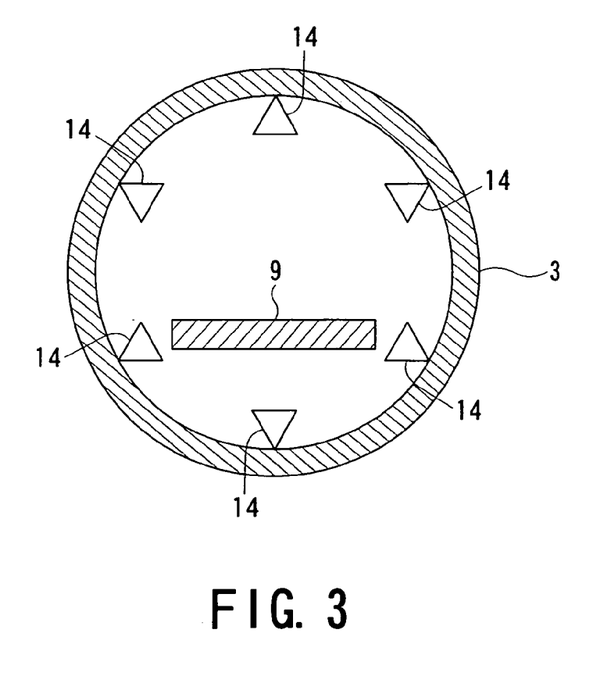
FIG. 3 is a side view showing how the reception-signal reception antennas illustrated in FIG. 2 are arranged.

FIG. 2 is a cross-sectional view of the second example of arrangement of the reception-signal reception antennas 14 illustrated in FIG. 1. FIG. 3 is a side view showing how the reception-signal reception antennas 14 illustrated in FIG. 2 are arranged.

In FIGS. 2 and 3, a structure other than the arrangement of the reception-signal reception antennas 14 is substantially the same as that in FIG. 1, so elements other than the reception-signal reception antennas 14, the gradient coil 3, and the table 9 are omitted.

As shown in FIG. 2, the reception-signal reception antennas 14 can be disposed adjacent to one end or both ends inside the gradient coil 3. In this case, as shown in FIG. 3, the plurality of reception-signal reception antennas 14 can be disposed along the inner periphery of the gradient coil 3. FIG. 3 shows an example in which six reception-signal reception antennas 14 are spaced at regular intervals along the inner periphery of the gradient coil 3 at each of the both ends (the number of the reception-signal reception antennas 14 is 12 in total).

Arranging the reception-signal reception antennas 14 at ends inside the static field magnet 2, as described above, can reduce adverse effects of nonuniformity of a static magnetic field intensity B0 (so-called B0 shift) with respect to radio waves from the reception-signal transmission antennas 11, which are reception targets for the reception-signal reception antennas 14, and adverse effects of a radio-frequency magnetic field B1.

The reception-signal transmission antennas 11 are capable of wirelessly transmitting a reception signal received from the radio-frequency reception coil 5 to the reception-signal reception antennas 14. The reception-signal reception antennas 14 function to receive the reception signal transmitted from the reception-signal transmission antennas 11. The reception-signal transmission antennas 11 are capable of transmitting reception signals at mutually different frequencies that are set so as to be tuned to the corresponding most adjacent reception-signal reception antennas 14. The reception-signal reception antennas 14 are capable of frequency-selectively receiving the reception signals having the corresponding tuned frequencies from the corresponding most adjacent reception-signal transmission antennas 11. The respective frequency bands of the tuned frequencies for the reception-signal reception antennas 14 are set so as not to overlap one another.

An amplifier 17 is disposed at a destination for each of the reception-signal reception antennas 14. A frequency filter 18 is disposed at a destination for the amplifier 17. The amplifier 17 functions to amplify the reception signal having the corresponding tuned frequency from the reception-signal reception antenna 14 and to supply the amplified signal to the frequency filter 18. The destination for the frequency filter 18 is the control device 8. The frequency filter 18 functions to extract a reception signal having a previously tuned specific frequency from reception signals having various frequencies received from the amplifier 17 and to output the extracted signal to the control device 8. In other words, the frequency filter 18 functions to select a reception signal having a tuned frequency from a plurality of received reception signals having different frequencies for each of the reception-signal reception antennas 14 and to output the selected signal to the control device 8.

This function of the frequency filter 18 allows, in particular, a reception signal having a tuned frequency of a reception-signal reception antenna 14 that is adjacent to the reception-signal transmission antenna 11 to pass through the frequency filter 18 and can block reception signals having other frequencies. In other words, by use of the frequency filter 18, a reception signal from the reception-signal reception antenna 14 adjacent to the reception-signal transmission antenna 11 can be selected while reception signals from other reception-signal reception antennas 14 can be unselected, so that only the reception signal from the reception-signal reception antenna 14 adjacent to the reception-signal transmission antenna 11 can be supplied to the control device 8.

Since a radio-frequency reception signal can be wirelessly communicated between the control device 8 and the radio-frequency reception coil 5, even if the radio-frequency reception coil 5 moves together with the table 9, complex cable wiring or a mechanism of moving cables, such as a retractor, are not necessary.

The positional-detection transmission antenna 13, which is provided on the movable system, functions to wirelessly transmit a positional detection signal for detecting the position of the radio-frequency reception coil 5. The positional-detection reception antennas 15, which are provided on the fixed system, function to receive the positional detection signal transmitted from the positional-detection transmission antenna 13 and to supply the received positional detection signal to the control device 8. Therefore, the positional-detection transmission antenna 13 is configured to transmit the positional detection signal whose frequency is tuned to each of the positional-detection reception antennas 15.

The control device 8 includes a signal processing system 19 and a transmission system 20. The transmission system 20 in the control device 8 is connected to the gradient power supply 6 and the radio frequency amplifier 7. The transmission system 20 functions to set a pulse sequence as an imaging condition, to supply a control signal according to the set pulse sequence to the gradient power supply 6 and the radio frequency amplifier 7, and to control them. This can form gradient magnetic fields according to the imaging condition in the imaging region and can cause a radio-frequency transmission signal to be transmitted to the object P.

The signal processing system 19 in the control device 8 includes a coil position estimating unit 21, an oscillation frequency control unit 22, and a reception data processing unit 23.

The coil position estimating unit 21 functions to estimate the position of the radio-frequency reception coil 5 on the basis of positional information on the table 9 received from the table control unit 10 and to supply the estimated positional information on the radio-frequency reception coil 5 to the oscillation frequency control unit 22. That is, from the position of the table-top of the table 9 at timing at which the object P is placed and the amount of movement of the table 9 after the object P is placed, the position of the table 9 can be estimated. At this time, a previously obtained image of the object P can be referred to if necessary. From the relative positional relationship between the table 9 and the radio-frequency reception coil 5 and the position of the table 9, the position of the radio-frequency reception coil 5 can be estimated geometrically.

The coil position estimating unit 21 can estimate the position of the radio-frequency reception coil 5 on the basis of, in addition to or instead of the positional information on the table 9, the positional detection signal received from each of the positional-detection reception antennas 15. That is, the coil position estimating unit 21 can estimate the position of the radio-frequency reception coil 5 from the phase difference between the positional detection signals obtained from the plurality of positional-detection reception antennas 15. By using the positional detection signals for detecting the position of the radio-frequency reception coil 5, the coil position estimating unit 21 can estimate the position of the radio-frequency reception coil 5 independently of the relative position between the radio-frequency reception coil 5 and the table 9. Therefore, the accuracy of estimating the position of the radio-frequency reception coil 5 can be improved.

The oscillation frequency control unit 22 functions to geometrically estimate the corresponding reception-signal reception antennas 14 adjacent to the reception-signal transmission antennas 11 disposed on the radio-frequency reception coil 5 on the basis of the estimated position of the radio-frequency reception coil 5 received from the coil position estimating unit 21 and to set frequencies of the respective reception signals wirelessly transmitted from the reception-signal transmission antennas 11 at the tuned frequencies of the corresponding adjacent reception-signal reception antennas 14. The transmission frequencies of the reception signals set by the oscillation frequency control unit 22 are supplied to the digital-communication transmission antenna 16 as oscillation-frequency data. The data can be digitally and wirelessly transmitted from the digital-communication transmission antenna 16 to the digital-communication reception antenna 12 connected to the radio-frequency reception coil 5.

The oscillation-frequency data set by the oscillation frequency control unit 22 may be transmitted to the digital-communication reception antenna 12 by use of transmission means, such as a digital serial optical link, in place of being wirelessly transmitted.

The reception data processing unit 23 functions to reconstruct image data of the object P by applying preprocessing and image reconstruction processing to a supplied reception signal that has passed through the frequency filter 18.

Figure 4:
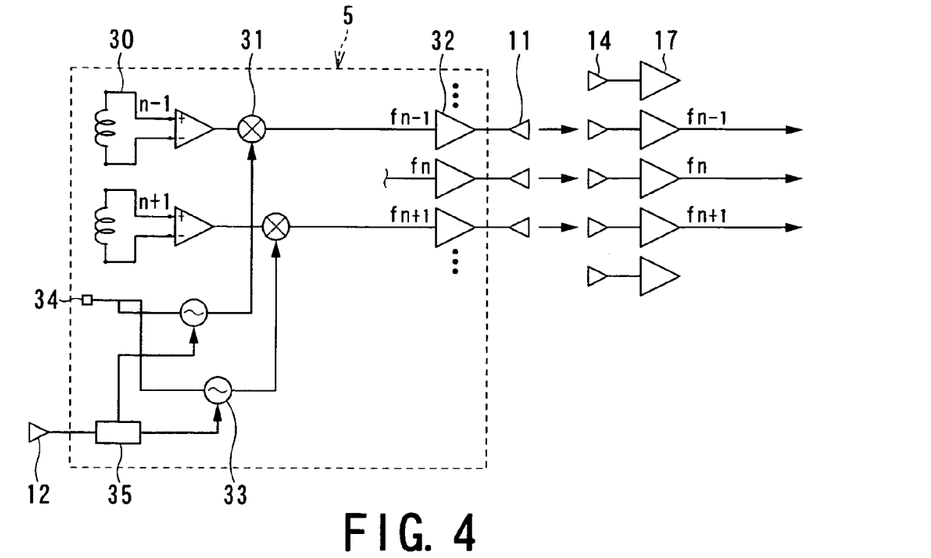
FIG. 4 is a circuit diagram of a circuit structure of the radio-frequency reception coil in the magnetic resonance imaging apparatus illustrated in FIG. 1.

FIG. 4 is a circuit diagram of a circuit structure of the radio-frequency reception coil 5 in the magnetic resonance imaging apparatus 1 illustrated in FIG. 1.

The radio-frequency reception coil 5 includes a plurality of element coils 30 for receiving NMR signals from the object P. The radio-frequency reception coil 5 incorporates a plurality of frequency converters 31, drivers 32, and frequency oscillators 33, corresponding to the plurality of element coils 30. The radio-frequency reception coil 5 also incorporates a synchronous clock terminal 34 and an oscillation frequency data receiving unit 35, which are common to the element coils 30.

The element coils 30 are connected to the respective frequency converters 31. NMR signals received by the element coils 30 ( . . . , n−1, n, n+1, . . . ) are subjected to frequency conversion (up conversion) in the respective frequency converters 31 so as to have mutually different frequencies ( . . . , fn−1, fn, fn+1, . . . ).

The frequency converters 31 are connected to the respective reception-signal transmission antennas 11 via the respective drivers 32. The reception signals converted so as to have predetermined mutually different frequencies are transmitted to the reception-signal transmission antennas 11 via the drivers 32 and then wirelessly transmitted. At this time, a frequency band of each of the frequency-converted reception signals for wireless transmission is set so as to be tuned to each of corresponding reception-signal reception antennas 14 adjacent to the reception-signal transmission antennas 11.

The wirelessly transmitted reception signals are received by the corresponding reception-signal reception antennas 14 adjacent to the reception-signal transmission antennas 11 and are amplified by the corresponding amplifiers 17 connected to the reception-signal reception antennas 14. Then the amplified signals are frequency-selectively output to the control device 8 via the frequency filter 18, which is subsequent to the amplifiers 17.

The oscillation frequency data receiving unit 35 is connected to the digital-communication reception antenna 12. The oscillation frequency data receiving unit 35 functions to control the oscillation frequency of each of the frequency oscillators 33 according to the oscillation-frequency data by obtaining the oscillation-frequency data received by the digital-communication reception antenna 12 and supplying the data to the frequency oscillator 33.

The frequency oscillator 33 can include a circuit, such as a PLL (phase locked loop) circuit. The frequency oscillator 33 functions to oscillate at a predetermined frequency in response to the oscillation-frequency data from the oscillation frequency data receiving unit 35. The frequency oscillators 33 are connected to the synchronous clock terminal 34, and the oscillation frequencies are synchronized. The destinations for the frequency oscillators 33 are the respective frequency converters 31. Each of the frequency converters 31 is configured so that the output from each of the frequency oscillators 33 and the reception signal transmitted from each of the element coils 30 are multiplied together. Therefore, in the frequency converter 31, the frequency of the reception signal transmitted from the element coil 30 is converted into the oscillation frequency of the frequency oscillator 33 in accordance with the oscillation-frequency data.

As described above, the reception signals having frequencies converted so as to be tuned to the corresponding reception-signal reception antennas 14 adjacent to the reception-signal transmission antennas 11 are wirelessly transmitted from the reception-signal transmission antennas 11.

A synchronization method required with the frequency conversion of a reception signal is described below.

Figure 5:
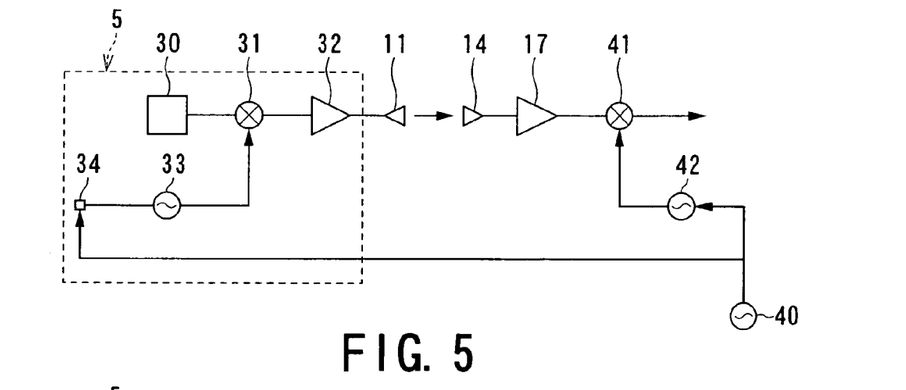
FIG. 5 is a circuit diagram for describing a first method for synchronizing a reception signal wirelessly transmitted from the radio-frequency reception coil illustrated in FIG. 4 accompanied by the frequency conversion.

FIG. 5 is a circuit diagram for describing a first method for synchronizing a reception signal wirelessly transmitted from the radio-frequency reception coil 5 illustrated in FIG. 4 accompanied by the frequency conversion. For ease of illustration, only one for the same components (e.g., element coils 30 or frequency oscillators 33) is shown in FIG. 5.

The oscillation frequency control unit 22 in the control device 8 includes a synchronous-clock generating oscillator 40. The reception data processing unit 23 in the control device 8 includes a frequency converter 41 and a frequency oscillator 42. The synchronous-clock generating oscillator 40 functions to generate a synchronous clock serving as a reference of synchronization. The generated synchronous clock is transmitted from the synchronous-clock generating oscillator 40 to the synchronous clock terminal 34. The synchronous clock may be wirelessly transmitted by being superimposed on the oscillation-frequency data. Alternatively, the synchronous clock may be transmitted by use of additionally provided transmission means, such as a digital serial optical link.

The frequency converter 41 in the reception data processing unit 23 functions to subject a reception signal received by the corresponding reception-signal reception antenna 14 and then amplified by the corresponding amplifier 17 to frequency conversion (down conversion). The frequency converter 41 is connected to the frequency oscillator 42. The frequency oscillator 42 is configured to generate a reference signal required for the frequency conversion performed by the frequency converter 41 and to output the reference signal to the frequency converter 41.

The synchronous-clock generating oscillator 40 is configured to supply a synchronous clock to not only the synchronous clock terminal 34 but also the frequency oscillator 42 in the reception data processing unit 23. As described above, a reference synchronous clock is supplied to the synchronous clock terminal 34 connected to the frequency oscillator 33 used for the up conversion for the reception signal and to the frequency oscillator 42 used for the down conversion for the reception signal, thus synchronizing the reception signal.

Another method for synchronizing a reception signal in frequency conversion is described below.

Figure 6:
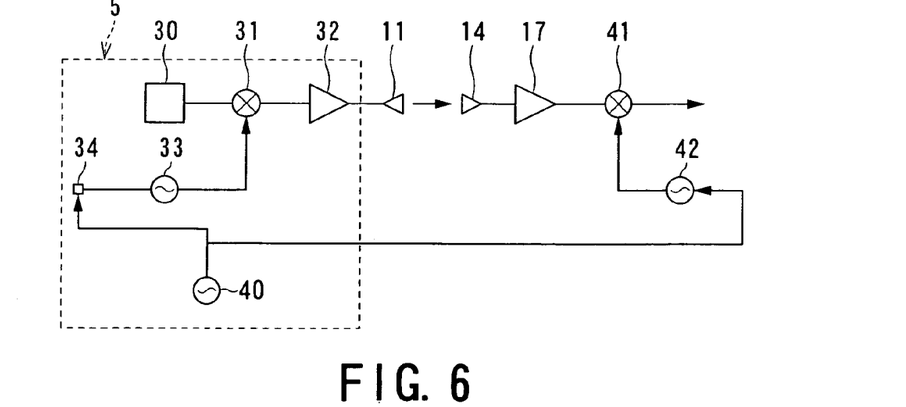
FIG. 6 is another circuit diagram for describing a second method for synchronizing a reception signal wirelessly transmitted from the radio-frequency reception coil illustrated in FIG. 4 accompanied by the frequency conversion.

FIG. 6 is another circuit diagram for describing a second method for synchronizing a reception signal wirelessly transmitted from the radio-frequency reception coil 5 illustrated in FIG. 4 accompanied by the frequency conversion. For ease of illustration, only one for the same components (e.g., element coils 30 or frequency oscillators 33) is shown in FIG. 6.

In the circuit illustrated in FIG. 5, the synchronous-clock generating oscillator 40 is disposed in the control device 8. Alternatively, the synchronous-clock generating oscillator 40 can be incorporated in the radio-frequency reception coil 5, as in the circuit illustrated in FIG. 6. In the case where the synchronous-clock generating oscillator 40 is incorporated in the radio-frequency reception coil 5, the synchronous clock is transmitted from the synchronous-clock generating oscillator 40 to the frequency oscillator 42 disposed in the control device 8. The synchronous clock may be wirelessly transmitted by being superimposed on the reception signal. Alternatively, the synchronous clock may be transmitted by use of additionally provided transmission means, such as a digital serial optical link.

An operation of the magnetic resonance imaging apparatus 1 is described below.

When the object P is placed on the table 9 and the table 9 is moved to the imaging position by an operation of the table control unit 10, the radio-frequency reception coil 5 is located. That is, positional information on the table 9 is supplied from the table control unit 10 to the coil position estimating unit 21 in the control device 8. When necessary, positional detection signals for detecting the position of the radio-frequency reception coil 5 are wirelessly transmitted from the positional-detection transmission antenna 13 disposed on the radio-frequency reception coil 5. Since the transmitted positional detection signals are tuned to the plurality of positional-detection reception antennas 15 disposed on the gantry, the positional detection signals are received by the positional-detection reception antennas 15. The positional detection signals received by the positional-detection reception antennas 15 are supplied to the coil position estimating unit 21 in the control device 8.

The coil position estimating unit 21 estimates the position of the radio-frequency reception coil 5 on the basis of the relative positional relationship between the table 9 and radio-frequency reception coil 5 and the positional information on the table 9 received from the table control unit 10. In the case where the positional detection signals for the radio-frequency reception coil 5 have been received by the plurality of positional-detection reception antennas 15, the phase difference between the positional detection signals is calculated and used for estimation of the position of the radio-frequency reception coil 5.

Next, from the obtained positional information on the radio-frequency reception coil 5, a frequency tuned to a corresponding reception-signal reception antenna 14 that is most adjacent to each of the reception-signal transmission antennas 11 disposed on the radio-frequency reception coil 5 is set. That is, the oscillation frequency control unit 22 sets the frequency of each of the reception signals wirelessly transmitted from the reception-signal transmission antennas 11 disposed on the radio-frequency reception coil 5 at the tuned frequency of each of the corresponding adjacent reception-signal reception antennas 14. The set transmission frequency of the reception signal is supplied as the oscillation-frequency data from the oscillation frequency control unit 22 to the digital-communication transmission antenna 16 and then is wirelessly transmitted from the digital-communication transmission antenna 16 to the digital-communication reception antenna 12, which is connected to the radio-frequency reception coil 5.

The control signal is supplied from the transmission system 20 to the gradient power supply 6 and the radio frequency amplifier 7 in accordance with a pulse sequence generated in the transmission system 20. The gradient power supply 6 supplies a current according to the control signal to the gradient coil 3 and forms desired gradient magnetic fields in an imaging region. The radio frequency amplifier 7 supplies the radio-frequency transmission coil 4 with a radio-frequency transmission signal amplified to a predetermined intensity and causes the radio-frequency transmission coil 4 to transmit a radio-frequency transmission signal toward an imaging section for the object P placed in the imaging region.

Thus an NMR signal is generated inside the object P and is received by each of the element coils 30 incorporated in the radio-frequency reception coil 5. The NMR signals received by the element coils 30 are guided as reception signals to the respective frequency converters 31. At this time, oscillation-frequency data received by the digital-communication reception antenna 12 disposed on the radio-frequency reception coil 5 is supplied to the frequency oscillators 33 via the oscillation frequency data receiving unit 35. The frequency oscillators 33 oscillate at frequencies tuned to the corresponding reception-signal reception antennas 14 that are most adjacent to the reception-signal transmission antennas 11 on the basis of the oscillation-frequency data. The oscillation frequencies are supplied to the respective frequency converters 31, and the reception signals are subjected to frequency conversion. The reception signals whose frequencies are locked at frequencies based on the oscillation-frequency data are transmitted to the respective reception-signal transmission antennas 11 via the respective drivers 32 and then wirelessly transmitted.

Since the wirelessly transmitted reception signals have locked frequencies, the reception signals are received by the corresponding reception-signal reception antennas 14 that are most adjacent to the reception-signal transmission antennas 11 and are amplified by the respective amplifiers 17. The amplified reception signals are supplied to the frequency filter 18, and a reception signal having a specific frequency band is selectively supplied to the reception data processing unit 23 in the control device 8.

The reception data processing unit 23 performs frequency conversion of the reception signal. At this time, the reception signal is synchronized on the basis of the reference synchronous clock generated by the synchronous-clock generating oscillator 40. Next, the reception data processing unit 23 applies preprocessing and image reconstruction processing to the reception signal, so that image data of the object P is reconstructed. After the image data is subjected to necessary image processing, the image data is displayed on a monitor (not shown) and used for diagnosis.

According to the magnetic resonance imaging apparatus 1 described above, since reception signals wirelessly transmitted from the reception-signal transmission antennas 11 are always tuned to the corresponding adjacent reception-signal reception antennas 14, the reception signals are received by the corresponding adjacent reception-signal reception antennas 14. As a result, the transmission distances for all the reception signals wirelessly transmitted from the plurality of reception-signal transmission antennas 11 can be uniformly reduced and optimized. Therefore, a decrease in SNR caused by signal attenuation occurring with space propagation of each of the reception signals can be significantly improved, and additionally, variations in the decrease in SNR for a reception signal wirelessly transmitted for each of the element coils 30 can be suppressed.

Figure 7:
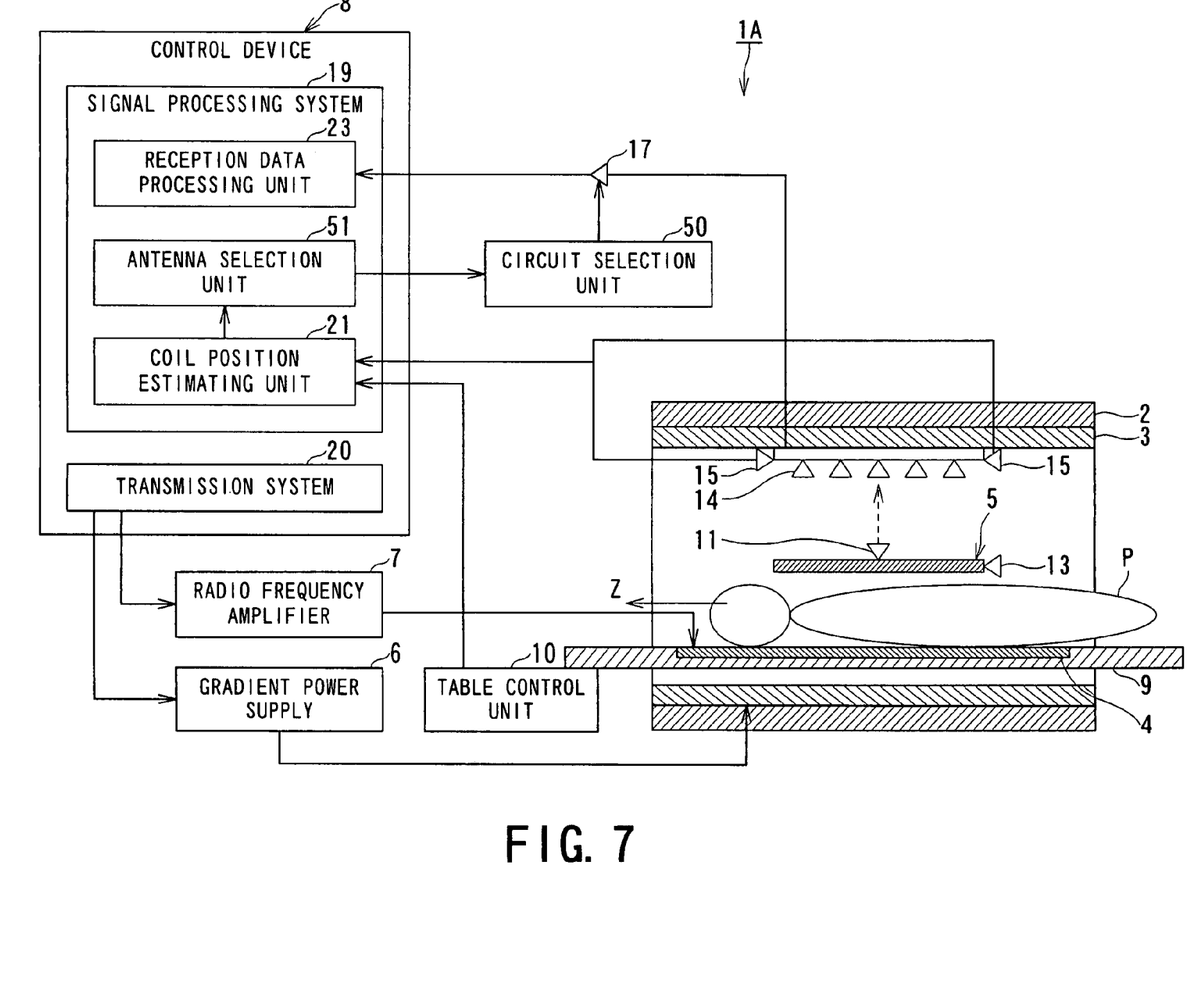
FIG. 7 is a diagram of a magnetic resonance imaging apparatus according to a second embodiment of the present invention.

FIG. 7 is a diagram of a magnetic resonance imaging apparatus according to a second embodiment of the present invention.

A magnetic resonance imaging apparatus 1A illustrated in FIG. 7 is different from the magnetic resonance imaging apparatus 1 illustrated in FIG. 1 in that a radio-frequency reception coil 5 is provided with a single reception-signal transmission antenna 11, in that a control device 8 has a different functional structure, and in that the frequency filter 18 is replaced with a circuit selection unit 50. Other structures and operations are substantially the same as in the magnetic resonance imaging apparatus 1 illustrated in FIG. 1. Therefore, the same reference numerals are used for similar components as in FIG. 1, and the description thereof is omitted.

In the magnetic resonance imaging apparatus 1A, the radio-frequency reception coil 5 is provided with the single reception-signal transmission antenna 11. Each of a plurality of reception-signal reception antennas 14 disposed on a gantry is connected to an amplifier 17. The output side of the amplifier 17 is connected to the control device 8. The amplifier 17 is also connected to the circuit selection unit 50.

A signal processing system 19 in the control device 8 includes a coil position estimating unit 21 for estimating the position of the radio-frequency reception coil 5 on the basis of positional information of the table 9 and/or a phase difference between a plurality of positional detection signals and a reception data processing unit 23 for processing a reception signal received from the amplifier 17. The signal processing system 19 also includes an antenna selection unit 51.

The antenna selection unit 51 functions to receive estimated positional information on the radio-frequency reception coil 5 from the coil position estimating unit 21 and to detect a reception-signal reception antenna 14 that is adjacent to the reception-signal transmission antenna 11 disposed on the radio-frequency reception coil 5 according to a geometric positional relationship. The result of detection of the reception-signal reception antenna 14 adjacent to the reception-signal transmission antenna 11 is supplied as selection information on the reception-signal reception antenna 14 from the antenna selection unit 51 to the circuit selection unit 50.

The circuit selection unit 50 functions to select a reception signal output to the amplifier 17 from the reception-signal reception antenna 14 adjacent to the reception-signal transmission antenna 11 in accordance with the selection information on the reception-signal reception antenna 14 received from the antenna selection unit 51 while not selecting reception signals output to the amplifiers 17 from other reception-signal reception antennas 14 and to transmit the selected reception signal to the reception data processing unit 23 in the control device 8.

Figure 8:
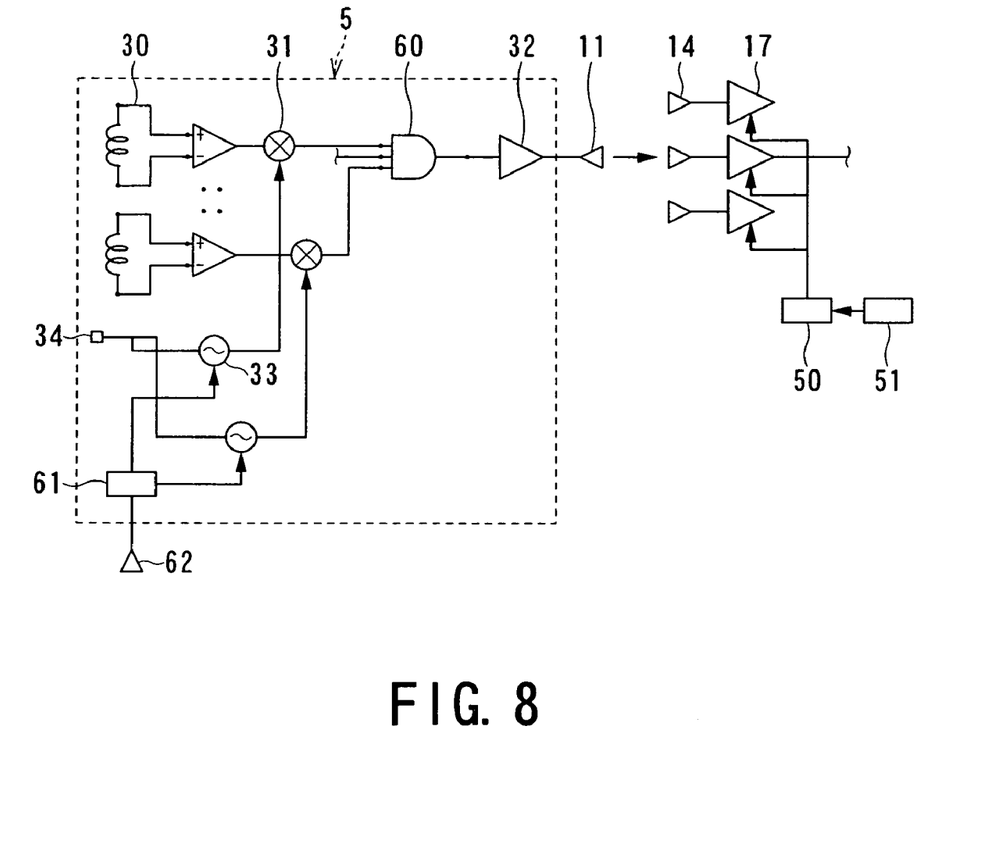
FIG. 8 is a circuit diagram of a circuit structure of the radio-frequency reception coil in the magnetic resonance imaging apparatus illustrated in FIG. 7.

FIG. 8 is a circuit diagram of a circuit structure of the radio-frequency reception coil 5 in the magnetic resonance imaging apparatus 1A illustrated in FIG. 7.

The radio-frequency reception coil 5 illustrated in FIG. 4 has a circuit structure in which reception signals received by the element coils 30 are wirelessly transmitted for each of the element coils 30 without being compounded (multiplexed) in the radio-frequency reception coil 5. In contrast, the radio-frequency reception coil 5 illustrated in FIG. 8 has a circuit structure in which reception signals received by the element coils 30 are compounded (multiplexed) in the radio-frequency reception coil 5 and wirelessly transmitted as a single reception signal.

A common compositor 60 is disposed at the output sides of the frequency converters 31 connected to the element coils 30. The output side of the compositor 60 is connected to the reception-signal transmission antenna 11 via a single driver 32. The frequency-converted reception signals received by the element coils 30 are compounded by the compositor 60 and transmitted as a single reception signal to the reception-signal transmission antenna 11 via the driver 32.

Frequency oscillators 33 for supplying different oscillation frequencies to the frequency converters 31 are connected to a common frequency control unit 61. These components are constructed such that, by supply of oscillation-frequency data set in the frequency control unit 61 to the frequency oscillators 33, frequency conversion is performed to the reception signals transmitted from the element coils 30 by the respective frequency converters 31 so as to have mutually different frequencies. The frequency control unit 61 is configured to set the oscillation-frequency data so that frequency bands of the frequency-converted reception signals from the element coils 30 for use in acquiring data for image reconstruction do not overlap one another.

The oscillation-frequency data may be transmitted from the outside of the radio-frequency reception coil 5 to the frequency control unit 61 by digital wireless communications or by use of transmission means, such as a digital serial optical link. In the case where the oscillation-frequency data is transmitted from the outside to the radio-frequency reception coil 5 by digital wireless communications, the frequency control unit 61 is connected to a digital wireless antenna 62.

The reception-signal reception antennas 14 for receiving a wirelessly transmitted reception signal are arranged along the direction of movement of the table 9 at a plurality of locations of the gantry. Each of the reception-signal reception antennas 14 is tuned in advance to a frequency band of a wirelessly transmitted reception signal which is multiplexed from frequency-converted reception signals from the element coils 30.

The reception-signal reception antennas 14 are connected to the respective amplifiers 17. The output sides of the amplifiers 17 are connected to the reception data processing unit 23 in the control device 8. In addition, the amplifiers 17 are connected to the circuit selection unit 50. The circuit selection unit 50 selects only a reception signal from an amplifier 17 that is connected to a reception-signal reception antenna 14 that is adjacent to the reception-signal transmission antenna 11 in response to selection information on the reception-signal reception antenna 14 received from the antenna selection unit 51 and outputs the selected reception signal to the control device 8.

In the magnetic resonance imaging apparatus 1A having the structure described above, when the coil position estimating unit 21 estimates the position of the radio-frequency reception coil 5, the antenna selection unit 51 detects the reception-signal reception antenna 14 adjacent to the reception-signal transmission antenna 11 on the basis of the estimated position of the radio-frequency reception coil 5. The result of detection is supplied as selection information on the reception-signal reception antenna 14 from the antenna selection unit 51 to the circuit selection unit 50.

When scanning is performed in accordance with an imaging condition, the element coils 30 of the radio-frequency reception coil 5 receive NMR signals. The NMR signals received by the element coils 30 are supplied as reception signals to the respective frequency converters 31. The frequency control unit 61 sets oscillation-frequency data in which the oscillation frequency is tuned to the reception-signal reception antenna 14 and the frequency bands of the frequency-converted reception signals from the element coils 30 do not overlap one another. When the oscillation-frequency data is supplied from the frequency control unit 61 to the frequency oscillators 33, the frequency oscillators 33 supply the oscillation frequencies according to the oscillation-frequency data to the respective frequency converters 31.

Therefore, the reception signals supplied from the element coils 30 to the respective frequency converters 31 are converted into respective frequencies whose frequency bands do not overlap one another by the respective frequency converters 31. The frequency-converted reception signals are supplied from the frequency converters 31 to the common compositor 60 and multiplexed by the compositor 60. The multiplexed reception signal is transmitted to the reception-signal transmission antenna 11 via the driver 32 and transmitted as a wireless signal.

The transmitted reception signal is received by the reception-signal reception antenna 14 adjacent to the reception-signal transmission antenna 11 and output to the corresponding amplifier 17. The circuit selection unit 50 selects only a reception signal supplied from the amplifier 17 connected to the most adjacent reception-signal reception antenna 14 in response to the selection information on the reception-signal reception antenna 14 and supplies the selected reception signal to the reception data processing unit 23 in the control device 8.

According to the magnetic resonance imaging apparatus 1A as described above, the same advantages as in the magnetic resonance imaging apparatus 1 illustrated in FIG. 1 can be obtained when the radio-frequency reception coil 5 multiplexing reception signals from the plurality of element coils 30 is included.

What is claimed is:

1. A magnetic resonance imaging apparatus comprising:
   a receiver coil configured to receive a nuclear magnetic resonance signal from an object as a reception signal;
   at least one reception signal transmitter antenna configured to transmit the reception signal from said receiver coil by radio;
   a plurality of reception signal receiver antennas arranged to receive the reception signal transmitted from said reception signal transmitter antenna;
   a signal selection unit configured to select a reception signal received by a specific single reception signal receiver antenna of said plural reception signal receiver antennas; and
   a reception data processing unit configured to reconstruct an image of the object from the reception signal selected by said signal selection unit.

2. A magnetic resonance imaging apparatus according to claim 1, wherein:
   said reception signal receiver antennas are arranged in at least a direction in which a table for setting the object moves and
   said signal selection unit is configured to select a reception signal received by a reception signal receiver antenna close to said reception signal transmitter antenna.

3. A magnetic resonance imaging apparatus according to claim 1, further comprising:
   a moving unit configured to move said receiver coil; and
   a coil position estimating unit configured to estimate a position of said receiver coil,
   wherein said signal selection unit is configured to select a reception signal received by a reception signal receiver antenna close to said reception signal transmitter antenna based on the position of said receiver coil estimated by said coil position estimating unit.

4. A magnetic resonance imaging apparatus according to claim 1, further comprising:
   a table moving unit configured to move said receiver coil with a table for setting the object; and
   a coil position estimating unit configured to estimate a position of said receiver coil based on a distance by which the table moved,
   wherein said signal selection unit is configured to select a reception signal received by a reception signal receiver antenna close to said reception signal transmitter antenna based on the position of said receiver coil estimated by said coil position estimating unit.

5. A magnetic resonance imaging apparatus according to claim 1, wherein:
   said receiver coil includes element coils,
   further comprising:
   a frequency control unit configured to control frequencies of reception signals received by said element coils respectively to make the reception signals showing mutually different frequency bands without overlapping; and
   a signal compounding unit configured to compound the reception signals so as to multiplex the reception signals from corresponding reception signal transmitter antennas,
   wherein said frequency control unit is configured to control the frequencies of the reception signals so as to tune the frequency bands of the reception signals multiplexed from the reception signal transmitter antennas to said reception signal receiver antennas.

6. A magnetic resonance imaging apparatus according to claim 1, wherein:
   said receiver coil includes element coils,
   further comprising: a frequency control unit configured to control frequencies of reception signals received by said element coils respectively to transmit the reception signals showing mutually different frequency bands without overlapping from reception signal transmitter antennas respectively, said frequency control unit being configured to control the frequencies of the reception signals so as to tune the frequencies to reception signal receiver antennas close to the reception signal transmitter antennas.

7. A magnetic resonance imaging apparatus according to claim 6, further comprising:
   a moving unit configured to move said receiver coil;
   a coil position estimating unit configured to estimate a position of said receiver coil; and a frequency data transmitting unit configured to detect the reception signal receiver antennas close to the reception signal transmitter antennas based on the position of said receiver coil estimated by said coil position estimating unit and transmit frequency data tuning to the detected reception signal receiver antennas to said frequency control unit, wherein said frequency control unit is configured to control the frequencies of the reception signals so as to tune the frequencies to the reception signal receiver antennas close to the reception signal transmitter antennas according to the frequency data obtained from said frequency data transmitting unit.

8. A magnetic resonance imaging apparatus according to claim 5, further comprising a synchronizing unit configured to synchronize the reception signals transmitted with frequency conversion by radio.

9. A magnetic resonance imaging apparatus according to claim 6, further comprising a synchronizing unit configured to synchronize the reception signals transmitted with frequency conversion by radio.

10. A magnetic resonance imaging apparatus according to claim 1, wherein said reception signal receiver antennas are arranged in a vicinity of an end part of an inside of a static field magnet.

11. A coil system for a magnetic resonance imaging apparatus comprising:

a receiver coil configured to receive a nuclear magnetic resonance signal from an object as a reception signal;

at least one reception signal transmitter antenna configured to transmit the reception signal from said receiver coil by radio;

a plurality of reception signal receiver antennas arranged to receive the reception signal transmitted from said reception signal transmitter antenna; and a signal selection unit configured to select a reception signal received by a specific single reception signal receiver antenna of said plural reception signal receiver antennas.

12. A magnetic resonance imaging method comprising:

receiving a nuclear magnetic resonance signal from an object as a reception signal;

transmitting the received reception signal by radio;

receiving the reception signal transmitted by radio by a plurality of reception signal receiver antennas;

selecting a reception signal received by a specific single reception signal receiver antenna of the plural reception signal receiver antennas; and reconstructing an image of the object from the selected reception signal.

13. A magnetic resonance imaging method comprising:

receiving a nuclear magnetic resonance signal at an MRI RF coil from an object as a reception signal;

wirelessly transmitting the reception signal from said MRI RF coil;

receiving the transmitted reception signal at a plurality of reception signal sites;

selecting a reception signal received by a specific single reception signal site of said plural reception signal sites; and reconstructing an image of the object from the selected reception signal.

14. A method as in claim 13 wherein:

said receiving step is performed by plural receiver RF antennas arranged in at least one direction in which a table for positioning the object moves and said selecting step includes selecting a reception signal received by a receiver RF antenna positioned relatively closer to the source of said transmitted reception signal than others of said antennas.

15. A method as in claim 13 further comprising:

moving said MRI RF coil; and estimating the position of said MRI RF coil;

wherein said selecting step includes selecting a signal received by one of plural signal receiver antennas that is nearest to an RF transmitter antenna based on the estimated position of the MRI RF coil and which is wirelessly transmitting the reception signal from the MRI RF coil.

16. A method as in claim 13 further comprising:

moving said MRI RF coil with a table for positioning the object; and estimating a position of said MRI RF coil based on a distance by which the table moves, wherein said signal selecting step is based on the estimated position of said MRI RF coil.

17. A method as in claim 13 further comprising:

controlling re-transmission RF frequencies of reception signals received by each of plural sub-element coils of said MRI RF coil respectively to make the reception signals for such sub-element coils occupy mutually different non-overlapping RF frequency bands; and multiplexing MRI RF reception signals from MRI RF coil sub-element transmitter antennas, wherein the frequency bands are multiplexed from MRI RF coil sub-element transmitter antennas to respectively corresponding signal receiver antennas.

18. A method as in claim 13 wherein:

re-transmission frequencies of MRI signals received by sub-element coils of the MRI RF coil are controlled to occupy respectively different non-overlapping frequency bands when transmitted by respectively corresponding transmitter antennas, said frequency bands being controlled so as to tune them to be received by receiver antennas disposed closest the respective transmitter antennas.

19. A method as in claim 18 further comprising:

moving said MRI RF coil;

estimating a position of said MRI RF coil; and detecting those reception signal receiver antennas disposed relatively closest to MRI RF coil transmitter antennas based on the estimated position of the MRI RF coil and transmitting data for frequency tuning such detected closest reception signal receiver antennas;

wherein the frequency bands of the transmitted MRI RF coil signals are respectively tuned based on the transmitted data for frequency tuning to a reception frequency band corresponding to a reception signal receiver antenna disposed closest to a corresponding MRI RF coil signal transmitter antenna.

20. A method as in claim 17 further comprising synchronizing MRI RF coil signals transmitted with frequency conversion by radio.

21. A method as in claim 18 further comprising synchronizing MRI RF coil signals transmitted with frequency conversion by radio.

22. A method as in claim 13 wherein reception signal receiver antennas are arranged at an inside end portion of a static field magnet of an MRI system.

23. A method for conveying MRI NMR signals during a magnetic resonance imagine process, said method comprising:

receiving MRI nuclear magnetic resonance (NMR) signals from an object at an MRI RF coil;

wirelessly transmitting the NMR signals from at least one location;

receiving the transmitted NMR signal from said transmitter location at a plurality of reception signal locations; and selecting for further MRI processing the NMR MRI signals received by a specific single one of said plural reception signal locations.

* * * * *